US012648315B2

(12) United States Patent
Shin et al.

(10) Patent No.: US 12,648,315 B2
(45) Date of Patent: Jun. 2, 2026

(54) DISPLAY PANEL

(71) Applicant: Samsung Display Co., Ltd., Yongin-si (KR)

(72) Inventors: Jonghwan Shin, Yongin-si (KR); Yuri Oh, Yongin-si (KR); Kibok Yoo, Yongin-si (KR); Donghyeok Lee, Yongin-si (KR); Jongchan Lee, Yongin-si (KR); Jinsuk Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 395 days.

(21) Appl. No.: 18/508,641

(22) Filed: Nov. 14, 2023

(65) Prior Publication Data

US 2024/0324345 A1 Sep. 26, 2024

(30) Foreign Application Priority Data

Mar. 24, 2023 (KR) ........................ 10-2023-0039081
Apr. 18, 2023 (KR) ........................ 10-2023-0050895

(51) Int. Cl.
*H10K 59/131* (2023.01)
*H10K 59/124* (2023.01)
*H10K 59/88* (2023.01)
*H10K 102/00* (2023.01)

(52) U.S. Cl.
CPC ......... *H10K 59/131* (2023.02); *H10K 59/124* (2023.02); *H10K 59/88* (2023.02); *H10K 2102/351* (2023.02)

(58) Field of Classification Search
CPC .... H10K 59/131; H10K 59/124; H10K 59/88; H10K 2102/351; H10K 59/8731
See application file for complete search history.

(56) References Cited

U.S. PATENT DOCUMENTS 11,049,927 B2 6/2021 Kim et al.
2021/0234125 A1* 7/2021 Sung .................... H10K 59/124
2022/0005903 A1* 1/2022 Kim .................... H10K 59/8731
(Continued)

FOREIGN PATENT DOCUMENTS

CN          112447790      3/2021
KR      10-2020-0144628   12/2020
KR      10-2022-0087664    6/2022

*Primary Examiner* — Mohammed R Alam
(74) *Attorney, Agent, or Firm* — Harness, Dickey & Pierce, P.L.C.

(57) ABSTRACT

A display panel includes an opening area, a display area surrounding at least a portion of the opening area, and an intermediate area between the opening area and the display area in a plan view, a light-emitting diode arranged on a substrate in the display area and including a pixel electrode, an opposite electrode, and an intermediate layer, a support layer arranged on the substrate in the intermediate area, an organic insulating layer arranged on the substrate and the support layer and having a groove corresponding to the support layer, a metal layer arranged on the organic insulating layer and having a protrusion tip, and a cover layer including a first cover portion covering an upper surface and a side surface of the metal layer and a second cover portion arranged in the groove. The functional layer extends to the intermediate area and includes a dummy functional layer.

20 Claims, 14 Drawing Sheets

(56) References Cited

U.S. PATENT DOCUMENTS

| | | |
|---|---|---|
| 2022/0085115 A1 | 3/2022 | Park et al. |
| 2022/0199946 A1 | 6/2022 | Lee et al. |
| 2023/0006175 A1 | 1/2023 | Kim et al. |

* cited by examiner

DISPLAY PANEL

CROSS REFERENCE TO RELATED APPLICATION(S)

This application claims priority to and benefits of Korean Patent Application No. 10-2023-0039081 under 35 U.S.C. § 119, filed on Mar. 24, 2023, and Korean Patent Application No. 10-2023-0050895 under 35 U.S.C. § 119, filed on Apr. 18, 2023, in the Korean Intellectual Property Office (KIPO), the entire contents of which are incorporated herein by reference.

BACKGROUND

1. Technical Field

Embodiments relate to a display panel.

2. Description of the Related Art

Recently, the usage of display panels has diversified. Display panels have become thinner and lighter, and a range of use of the display panels has expanded.

As an area occupied by a display area in a display panel has increased, various functions connected to or associated with display panels have been added. As a method of increasing the display area and adding various functions, research has been conducted to arrange various components in a portion of the display area.

SUMMARY

The disclosure provides a display panel including a display area having an area for arranging various types of components, the display panel having improved reliability. However, this objective is merely an example and does not limit the scope of the disclosure.

Additional aspects will be set forth in part in the description which follows and, in part, will be apparent from the description, or may be learned by practice of embodiments of the disclosure.

According to an embodiment, a display panel may include an opening area, a display area surrounding at least a portion of the opening area, and an intermediate area between the opening area and the display area in a plan view, a light-emitting diode arranged on a substrate in the display area and including a pixel electrode, an opposite electrode, and an intermediate layer arranged between the pixel electrode and the opposite electrode and including a functional layer and an emission layer, a support layer arranged on the substrate in the intermediate area, an organic insulating layer arranged on the substrate and the support layer and having a groove corresponding to the support layer, a metal layer arranged on the organic insulating layer and having a protrusion tip protruding toward the groove, and a cover layer including a first cover portion covering an upper surface and a side surface of the metal layer and a second cover portion arranged in the groove. The functional layer may extend to the intermediate area and may include a dummy functional layer arranged on the second cover portion.

The organic insulating layer may cover at least a portion of the support layer.

The first cover portion and the second cover portion may be spaced apart from each other.

A first distance from an upper surface of the substrate to an edge of the second cover portion may be greater than a second distance from the upper surface of the substrate to an edge of the dummy functional layer.

The dummy functional layer may expose an edge of the second cover portion.

The dummy functional layer may be spaced apart from the organic insulating layer.

A first angle formed by a first virtual line extending from an edge of the second cover portion to an edge of the protrusion tip with an upper surface of the substrate may be less than a second angle formed by a second virtual line extending from an edge of the dummy functional layer to the edge of the protrusion tip with the upper surface of the substrate.

The cover layer and the pixel electrode may include a same material.

The support layer may include a metal.

The display panel may further include a thin-film transistor arranged in the display area and including a semiconductor layer and a gate electrode. The support layer and a line arranged on an interlayer insulating layer covering the gate electrode may be arranged on a same layer.

The display panel may further include an inorganic insulating layer arranged on the substrate and continually extending from the display area to the intermediate area. The support layer may be arranged on the inorganic insulating layer.

According to an embodiment, a display panel may include an opening area, a display area surrounding at least a portion of the opening area, and an intermediate area between the opening area and the display area in a plan view, a light-emitting diode arranged on a substrate in the display area and including a pixel electrode, an opposite electrode, and an intermediate layer arranged between the pixel electrode and the opposite electrode and including a functional layer and an emission layer, an inorganic insulating layer arranged on a substrate and continually extending from the display area to the intermediate area, a support layer arranged on the inorganic insulating layer in the intermediate area and including a metal, an organic insulating layer arranged on the inorganic insulating layer and the support layer and having a groove corresponding to the support layer, a metal layer arranged on the organic insulating layer and having a protrusion tip protruding toward the groove, and a cover layer including a first cover portion covering an upper surface and a side surface of the metal layer and a second cover portion arranged in the groove. The cover layer and the pixel electrode may include a same material.

The second cover portion may expose at least a portion of the organic insulating layer.

The organic insulating layer may cover at least a portion of the support layer.

The functional layer may extend to the intermediate area and may include a dummy functional layer arranged on the second cover portion.

The dummy functional layer may expose an edge of the second cover portion.

A first distance from an upper surface of the substrate to an edge of the second cover portion may be greater than a second distance from the upper surface of the substrate to an edge of the dummy functional layer.

A first angle formed by a first virtual line extending from an edge of the second cover portion to an edge of the protrusion tip with an upper surface of the substrate may be less than a second angle formed by a second virtual line extending from an edge of the dummy functional layer to the edge of the protrusion tip with the upper surface of the substrate.

The display panel may further include a thin-film transistor arranged in the display area and including a semiconductor layer and a gate electrode. The support layer and a line arranged on an interlayer insulating layer covering the gate electrode may be arranged on a same layer.

The support layer and the line may include a same material.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
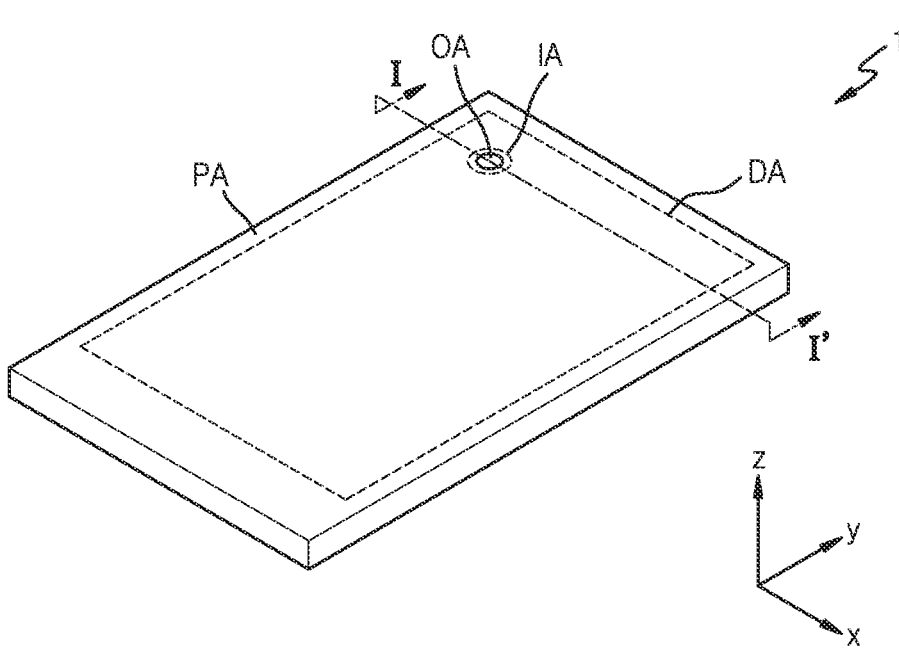
FIG. 1 is a schematic perspective view of an electronic apparatus in accordance with an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. Throughout the disclosure, the expression "at least one of a, b, and c" indicates only a, only b, only c, both a and b, both a and c, both b and c, all of a, b, and c, or variations thereof.

While the disclosure provides various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to elements that are the same or substantially the same and descriptions will not be repeated.

The terminology used herein is for the purpose of describing particular embodiments and is not intended to be limiting. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

It will be understood that although the terms "first." "second," etc. may be used herein to describe various components, these components should not be limited by these terms. These components are only used to distinguish one component from another. Thus, a first element discussed below could be termed a second element without departing from the teachings of the disclosure.

As used herein, the singular expressions "a," "an," and "the" are intended to include the plural forms as well, unless the context clearly indicates otherwise.

It will be further understood that the terms "comprises." "includes," "has." "comprising." "including." and/or "having" used herein specify the presence of stated features, components, elements, features, integers, steps, operations, and/or group thereof, but do not preclude the presence or addition of one or more other features, components, elements, features, integers, steps, operations, and/or group thereof.

It will be understood that when a layer, region, or element is referred to as being formed "on" another layer, area, or element, it can be directly or indirectly formed on the other layer, region, or element. For example, intervening layers, regions, or elements may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

When a component is described herein to "connect" another component to the other component or to be "connected to" other components, the components may be connected to each other as separate elements, or the components may be integral with each other.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer. Also, when an element is referred to as being "in contact" or "contacted" or the like to another element, the element may be in "electrical contact" or in "physical contact" with another element; or in "indirect contact" or in "direct contact" with another element.

As used herein, the term "and/or" includes any and all combinations of one or more of the associated listed items. In this specification, the expression "A and/or B" may indicate A, B. or A and B. Also, the expression "at least one of A and B" may indicate A, B, or A and B. The terms "and" and "or" may be used in the conjunctive or disjunctive sense and may be understood to be equivalent to "and/or."

Spatially relative terms, such as "below," "lower," "above," "upper," "higher." "side," and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The display surface may be parallel to a surface defined by an x direction and a y direction. A normal direction of the display surface, i.e., a thickness direction of the display apparatus, may indicate a z direction. In this specification, an expression of "when viewed from the top or in a plan view" may represent a case when viewed in the z direction. Hereinafter, a front surface (or a top surface) and a rear surface (or a bottom surface) of each of layers or units may be distinguished by the z direction. However, directions indicated by the x, y, and z directions may be a relative concept, and converted with respect to each other, e.g., converted into opposite directions.

When an embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings. Further, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic perspective view of an electronic apparatus 1 in accordance with an embodiment.

Referring to FIG. 1, the electronic apparatus 1 may include an apparatus for displaying a video or a static image and may be used as display screens not only of portable electronic apparatuses, such as a mobile phone, a smart phone, a tablet personal computer (PC), a mobile communication terminal, an electronic notebook, an electronic book, a portable multimedia player (PMP), a navigation device, a ultra-mobile PC (UMPC), and the like, but also of various products, such as a television, a notebook computer, a monitor, a broadcasting panel, Internet of things (IoT) device, and the like. The electronic apparatus 1 according to an embodiment may be also used in wearable devices, such as a smart watch, a watch phone, a glasses-type display, a head-mounted display (HMD), and the like. The electronic apparatus 1 according to an embodiment may be also used as a center information display (CID) on a gauge of a vehicle or a center fascia or a dashboard of the vehicle, a room mirror display substituting a side-view mirror of a vehicle, a display disposed on a rear surface of a front seat, or an entertainment device for a backseat of a vehicle. The electronic apparatus 1 may be bendable, foldable, or rollable. FIG. 1 illustrates that the electronic apparatus 1 according to an embodiment is used as a smartphone, for convenience of explanation, but the disclosure is not limited thereto.

The electronic apparatus 1 may have a rectangular shape in a plan view. For example, the electronic apparatus 1 may have the rectangular shape having a short side in an x direction and a long side in a y direction in a plan view, as illustrated in FIG. 1. The y direction may intersect the x direction. A corner at which the short side in the x direction and the long side in the y direction meet each other may be formed with a curvature (e.g., a predetermined or selectable curvature) or may be formed with a right angle. However, the electronic apparatus 1 in a plan view is not limited thereto, and may have other polygonal shapes, an oval shape, an amorphous shape, or the like.

The electronic apparatus 1 may include an opening area OA (or a first area) and a display area DA (or a second area) at least partially surrounding the opening area OA. The electronic apparatus 1 may include an intermediate area IA between the opening area OA and the display area DA and a peripheral area PA arranged adjacent to (or surrounding) the display area DA. Each of the intermediate area IA and the peripheral area PA may correspond to a non-display area and not emit light.

The opening area OA may be arranged at a portion (e.g., an inner portion) of the display area DA. According to an embodiment, the opening area OA may be arranged at an upper left side of the display area DA, as illustrated in FIG. 1. However, the disclosure is not limited thereto, and the opening area OA may be arranged at various sides of the display area DA, such as an upper middle side, an upper right side, the like, or a combination thereof of the display area DA. The expression "left," "right, "upper," or "lower" with respect to a plan view of the disclosure may be a direction with respect to the electronic apparatus 1 viewed in a direction perpendicular to the electronic apparatus 1. For example, the expression "left" may be a −x direction, the expression "right" may be a +x direction, the expression "upper" may be a +y direction, and the expression "lower" may be a −y direction. FIG. 1 illustrates that one opening area OA is arranged in the display area DA. However, according to another embodiment, multiple opening areas OA may be arranged in the display area DA.

Figure 2:
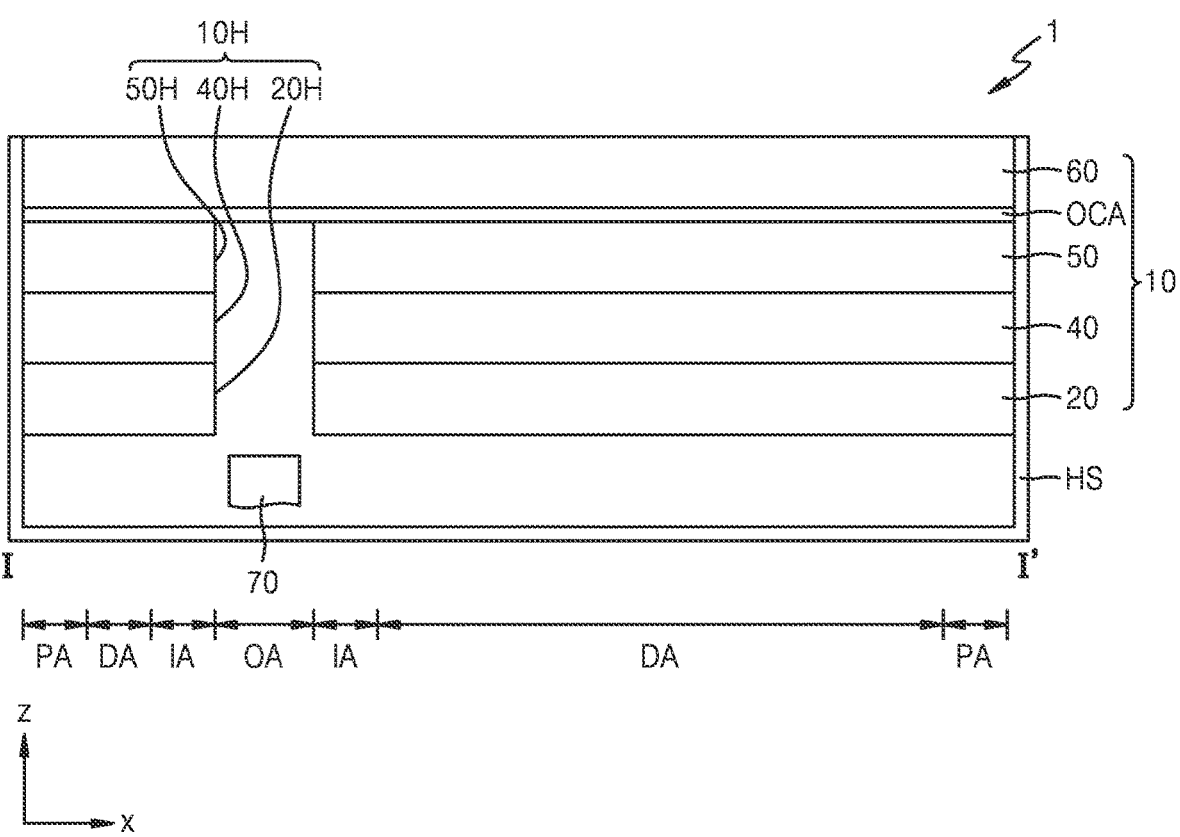
FIG. 2 is a schematic cross-sectional view of a display panel taken along line I-I' of FIG. 1 in accordance with an embodiment.

FIG. 2 is a schematic cross-sectional view of a display panel 10 taken along line I-I' of FIG. 1 in accordance with an embodiment.

Referring to FIG. 2, the electronic apparatus 1 may include a display panel 10 and a component 70 arranged in the opening area OA of the display panel 10. The display panel 10 and the component 70 may be accommodated in a housing HS.

The display panel 10 may include a display layer 20, an input sensing layer 40, an optical functional layer 50, and a cover window 60.

The display layer 20 may include display elements (or emission elements) that emits light and display an image and pixel circuits respectively connected to the display elements and applying electrical signals to the display elements. The display element may include a light-emitting diode, for example, an organic light-emitting diode including an organic emission layer or the like.

The input sensing layer 40 may obtain coordinate information based on an external input, for example, a touch event. The input sensing layer 40 may include a sensing electrode (or a touch electrode) and trace lines electrically connected to the sensing electrode (or the touch electrode). The input sensing layer 40 may be arranged on the display layer 20. The input sensing layer 40 may sense an external input by using a mutual cap method, a self-cap method, the like, or a combination thereof.

The input sensing layer 40 may be formed on (e.g., directly on) the display layer 20 or may be coupled to the display layer 20 through an adhesive layer (not shown), such as an optical clear adhesive (OCA) or the like, after being separately formed. For example, a process of forming the input sensing layer 40 may be sequentially performed after a process of forming the display layer 20, and the adhesive layer may not be arranged between the input sensing layer 40 and the display layer 20. FIG. 2 illustrates that the input sensing layer 40 is arranged between the display layer 20 and the optical functional layer 50. However, the disclosure is not limited thereto, and according to another embodiment, the input sensing layer 40 may be arranged on the optical functional layer 50.

The optical functional layer 50 may include a reflection prevention layer. The reflection prevention layer may reduce a reflectivity of light (external light) incident toward the display panel 10 from an outside through the cover window 60. The reflection prevention layer may include a phase retarder, a polarizer, the like, or a combination thereof. The phase retarder may include a film-type phase retarder, a liquid crystal coating-type phase retarder, or the like. The polarizer may include a film-type polarizer, a liquid crystal coating-type polarizer, or the like. The film-type polarizer may include an elongation-type synthetic resin film or the like, and the liquid crystal coating-type polarizer may include liquid crystals arranged in a shape (e.g., a certain or selectable shape) or the like.

According to another embodiment, the reflection prevention layer may include a black matrix, color filters, the like, or a combination thereof. The color filters may be arranged corresponding to a color of light emitted from each of the light-emitting diodes of the display layer 20. According to another embodiment, the reflection prevention layer may include a destructive interference structure. The destructive interference structure may include a first reflective layer and a second reflective layer arranged on different layers. First reflective light and second reflective light reflected from the first reflective layer and the second reflective layer, respectively, may destructively interfere, and the reflectivity of external light may be decreased.

The optical functional layer 50 may include a lens layer (not shown). The lens layer may increase an extraction efficiency of the light emitted from the display layer 20 or may reduce a color deviation. The lens layer may include a layer having a concave or convex lens shape or/and may include multiple layers having different refractive indexes. The optical functional layer 50 may include both of the reflection prevention layer and the lens layer or one of the reflection prevention layer and the lens layer.

The display panel 10 may include an opening 10H. In an embodiment, referring to FIG. 2, the display layer 20 may include a first opening 20H, the input sensing layer 40 may include a second opening 40H, the optical functional layer 50 may include a third opening 50H, and the first to third openings 20H, 40H, and 50H may overlap each other in a plan view.

The first opening 20H may penetrate from a top surface of the display layer 20 to a bottom surface of the display layer 20, the second opening 40H may penetrate from a top surface of the input sensing layer 40 to a bottom surface of the input sensing layer 40, and the third opening 50H may penetrate from a top surface of the optical functional layer 50 to a bottom surface of the optical functional layer 50.

The opening 10H of the display panel 10, for example, the first to third openings 20H, 40H, and 50H, may be arranged in the opening area OA and overlap each other in a plan view. Sizes (or diameters) of the first to third openings 20H, 40H, and 50H may be the same or different from each other.

According to another embodiment, at least one of the display layer 20, the input sensing layer 40, and the optical functional layer 50 may not include an opening. For example, one or two of the display layer 20, the input sensing layer 40, and the optical functional layer 50 may not include an opening.

The cover window 60 may be arranged on the optical functional layer 50. The cover window 60 may be coupled to the optical function layer 50 through an adhesive layer, such as an OCA or the like, arranged between the optical function layer 50 and the cover window 60. The cover window 60 may include a glass material, a plastic material, or the like. For example, the cover window 60 may be an ultra-thin glass window. For example, the cover window 60 may include polyether sulfone, polyacrylate, polyether imide, polyethylene naphthalate, polyethylene terephthalate, polyphenylene sulfide, polyarylate, polyimide, polycarbonate, cellulose acetate propionate, the like, or a combination thereof.

The opening area OA may be a component area (for example, a sensor area, a camera area, a speaker area, the like, or a combination thereof), in which the component 70 for adding various functions to the electronic apparatus 1 is arranged. The component 70 may be arranged below the display panel 10 and overlap the opening 10H of the display panel 10 in a plan view.

The component 70 may include an electronic element. For example, the component 70 may include an electronic element using light, sound, or the like. For example, the electronic element may include a sensor that uses light such as an infrared sensor or the like, a camera the receives light or captures an image, a sensor that measures a distance or recognizes a fingerprint, or the like by outputting and sensing light, sound, or the like, a small lamp that outputs light, a speaker that outputs sound, or the like. The electronic element using light may use light of various wavelength ranges, such as visible rays, infrared rays, ultraviolet rays, the like, or a combination thereof. The opening area OA may correspond to a transmission area through which light or/and sound output from the component 70 to an outside or proceeding from the outside toward the electronic element are transmitted.

According to another embodiment, in case that the electronic apparatus 1 is a smart watch, a vehicle dashboard, or the like, the component 70 may be a member including clock hands, hands, or the like indicating an information (for example, a vehicle speed or the like). The cover window 60 may include an opening arranged in the opening area OA, unlike FIG. 1, and the component 70, such as the hands or the like, may be exposed to the outside. According to another embodiment, in case that the electronic apparatus 1 includes the component 70, such as a speaker or the like, the cover window 60 may include an opening corresponding to the opening area OA.

Figure 3:
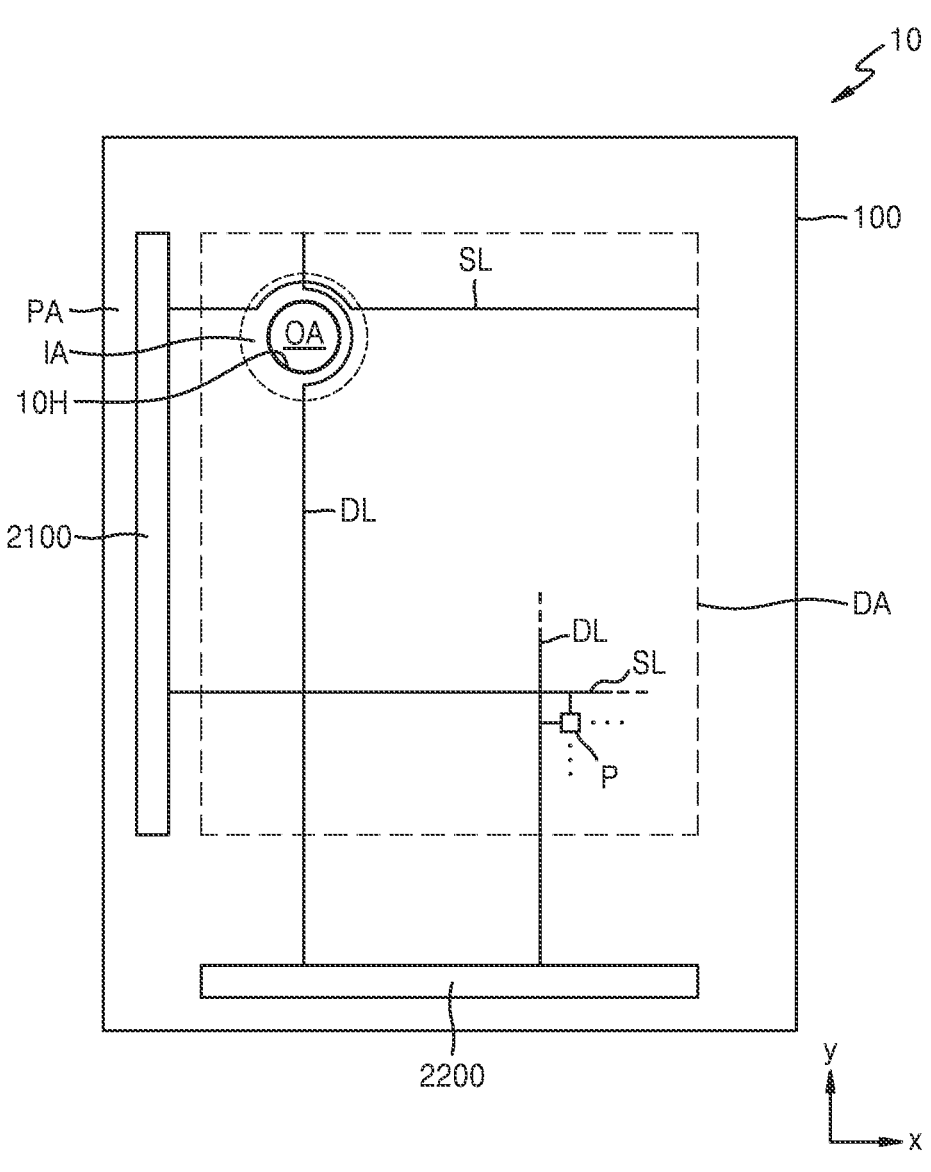
FIG. 3 is a schematic plan view of a display panel in accordance with an embodiment.

FIG. 3 is a schematic plan view of the display panel 10 in accordance with an embodiment.

Referring to FIG. 3, the display panel 10 may include an opening area OA, a display area DA, an intermediate area IA, and a peripheral area PA.

The display panel 10 may include multiple pixels P arranged in the display area DA. The pixel P may be a minimum area for emitting light and may be an area for emitting red, green, or blue light. The display panel 10 may display an image using the light emitted from a light-emitting diode of each pixel P.

Each pixel P may include a light-emitting diode. For example, each pixel P may include an organic light-emitting diode as a display element. According to another embodiment, the display panel 10 may include an inorganic light-emitting diode. Hereinafter, the pixel P including an organic light-emitting diode as a display element is described as an embodiment. That the pixel P is arranged in the display area DA may indicate that the organic light-emitting diode OLED is arranged in the display area DA.

The intermediate area IA may surround the opening area OA in a plan view. The intermediate area IA may be an area in which the display element emitting light, such as the organic light-emitting diode or the like, is not arranged, and signal lines that provides signals to pixels P arranged adjacent to (or surrounding) the opening area OA may be arranged in the intermediate area MA. For example, while data lines DL and/or scan lines SL extend in the display area DA in a y direction and/or an x direction, portions of the data lines DL and/or the scan lines SL may detour along an edge of the opening 10H of the display panel 10 in the intermediate area IA, formed in the opening area OA.

A scan driver 2100 that provides a scan signal (see, e.g., Sn, Sn', Sn−1, Sn+1 of FIG. 4B) to each pixel P, a data driver 2200 that provides a data signal to each pixel P, and a first main power line (not shown) and a second main power line (not shown) that respectively provides a first power voltage and a second power voltage may be arranged in the peripheral area PA. FIG. 3 illustrates that the data driver 2200 is arranged adjacent to a side of a substrate 100. However, the disclosure is not limited thereto, and according to another embodiment, the data driver 2200 may be arranged on a printed circuit board (PCB) electrically connected to a pad arranged on a side of the display panel 10.

Figure 4A:
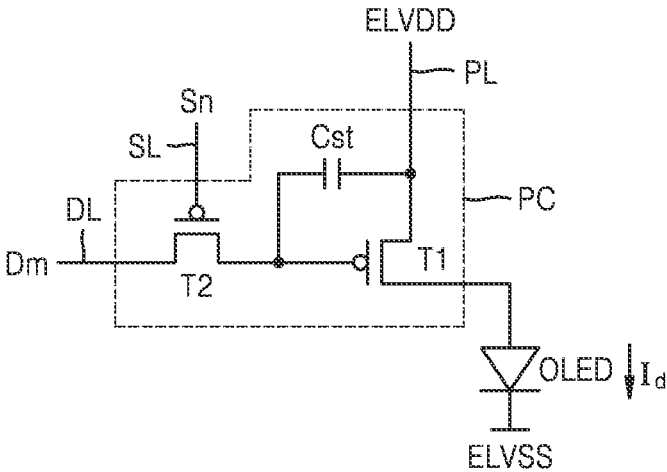
FIG. 4A is a schematic diagram of an equivalent circuit of a pixel included in a display panel in accordance with an embodiment.
Figure 4B:
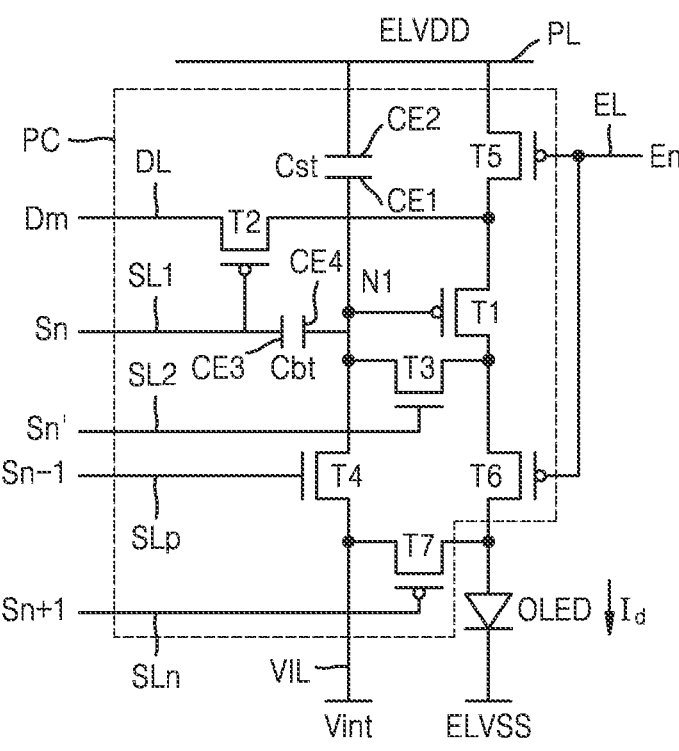
FIG. 4B is a schematic diagram of an equivalent circuit of a pixel included in a display panel in accordance with an embodiment.

FIGS. 4A and 4B are schematic diagrams of equivalent circuits of a pixel P included in a display panel 10 according to embodiments.

Referring to FIG. 4A, a pixel P may include a pixel circuit PC electrically connected to a scan line SL, a data line DL, and a driving voltage line PL, and an organic light-emitting diode OLED electrically connected to the pixel circuit PC. The pixel circuit PC may include a first transistor T1, a second transistor T2, and a storage capacitor Cst. The second transistor T2 may be a switching transistor. The second transistor T2 may be electrically connected to the scan line SL and the data line DL and may transmit, to the first transistor T1, a data signal Dm provided through the data line DL, in response to a scan signal Sn provided through the scan line SL.

The storage capacitor Cst may be electrically connected to the second transistor T2 and the driving voltage line PL and may store a voltage corresponding to a difference between a voltage received from the second transistor T2 and a first power voltage ELVDD (or a driving voltage) supplied from the driving voltage line PL.

The first transistor T1 may be a driving transistor. The first transistor T1 may be electrically connected to the driving voltage line PL and the storage capacitor Cst and may control a driving current $I_d$ flowing from the driving voltage line PL to the organic light-emitting diode OLED according to a value of the voltage stored in the storage capacitor Cst. The organic light-emitting diode OLED may emit light having a brightness (e.g., a certain or selectable brightness) according to the driving current $I_d$.

An opposite electrode (for example, a cathode) of the organic light-emitting diode OLED may receive a second power voltage ELVSS (or a common voltage). The organic light-emitting diode OLED may emit light by receiving a driving current $I_d$ from the first transistor T1.

Referring to FIG. 4B, the pixel circuit PC may include first to seventh transistors T1, T2, T3, T4, T5, T6, and T7, a storage capacitor Cst, and a boost capacitor Cbt. According to an embodiment, the pixel circuit PC may not include the boost capacitor Cbt, and hereinafter, the pixel circuit PC including the boost capacitor Cbt will be described.

Some of the first to seventh transistors T1 to T7 may be n-channel metal-oxide semiconductor field effect transistors (n-channel MOSFET) (NMOS transistors), and the others may be p-channel metal-oxide semiconductor field-effect transistors (p-channel MOSFET) (PMOS transistors). For example, the third and fourth transistors T3 and T4 may be NMOS transistors, and the others (e.g., the first, second, fifth to seventh transistors T1, T2, T5 to T7) may be PMOS transistors. According to another embodiment, the third, fourth, and seventh transistors T3, T4, and T7 may be NMOS transistors, and the others (e.g., the first, second, fifth, and sixth transistors T1, T2, T5, and T6) may be PMOS transistors. According to another embodiment, only one of the first to seventh transistors T1 to T7 may be an NMOS transistor, and the others may be PMOS transistors.

The first to seventh transistors T1 to T7, the storage capacitor Cst, and the boost capacitor Cbt may be electrically connected to signal lines SL1, SL2, SLp, EL, SLn, and DL. The signal lines may include a first scan line SL1 that transmits a first scan signal Sn, a second scan signal SL2 that transmits a second scan signal Sn', a previous (or preceding) scan line SLp that transmits a previous (or preceding) scan signal Sn−1, an emission control line EL that transmits an emission control signal En, a next (or following) scan line SLn that transmits a next (or following) scan signal Sn+1, and a data line DL that transmits a data signal Dm.

A driving voltage line PL may transmit a first power voltage ELVDD to the first transistor T1, and an initialization voltage line VIL may transmit the initialization voltage Vint to the first transistor T1 and initialize a first gate electrode of the first transistor T1 and a pixel electrode (see, e.g., 210 of FIG. 6) of the organic light-emitting diode OLED.

The first transistor T1 may be a driving transistor. The first gate electrode (or a first control electrode) of the first transistor T1 may be electrically connected to the storage capacitor Cst, a first electrode of the first transistor T1 may be electrically connected to the driving voltage line PL through the fifth transistor T5, and a second electrode of the first transistor T1 may be electrically connected to the pixel electrode of the organic light-emitting diode OLED through the sixth transistor T6. One of the first and second electrodes of the first transistor T1 may be a source electrode, and another one of the first and second electrodes of the first transistor T1 may be a drain electrode. The first transistor T1 may receive a data signal Dm according to a switching operation of the second transistor T2 and supply a driving current $I_d$ to the organic light-emitting diode OLED.

The second transistor T2 may be a switching transistor. A second gate electrode (or a second control electrode) of the second transistor T2 may be electrically connected to the first scan line SL1, a first electrode of the second transistor T2 may be electrically connected to the data line DL, and a second electrode of the second transistor T2 may be electrically connected to the first electrode of the first transistor T1 and may be electrically connected to the driving voltage line PL through the fifth transistor T5. One of the first and second electrodes of the second transistor T2 may be a source electrode, and another one of the first and second electrodes of the second transistor T2 may be a drain electrode. The second transistor T2 may be turned on in response to the first scan signal Sn transmitted through the first scan line SL1 and may perform a switching operation of transmitting the data signal Dm transmitted through the data line DL to the first electrode of the first transistor T1.

The third transistor T3 may be a compensation transistor that compensates for a threshold voltage of the first transistor T1. A third gate electrode (or a compensation control electrode) of the third transistor T3 may be electrically connected to the second scan line SL2. A first electrode of the third transistor T3 may be electrically connected to a lower electrode CE1 of the storage capacitor Cst and the first gate electrode of the first transistor T1 through a first node N1.

The first node N1 may be an area to which the first gate electrode of the first transistor T1, the first electrode of the third transistor T3, a second electrode of the fourth transistor T4, and a fourth electrode CE4 of the boost capacitor Cbt are electrically connected.

The first electrode of the third transistor T3 may be electrically connected to the fourth transistor T4. A second electrode of the third transistor T3 may be electrically connected to the second electrode of the first transistor T1 and may be electrically connected to the pixel electrode of the organic light-emitting diode OLED through the sixth transistor T6. One of the first and second electrodes of the third transistor T3 may be a source electrode, and another one of the first and second electrodes of the third transistor T3 may be a drain electrode.

The third transistor T3 may be turned on in response to the second scan signal Sn' transmitted through the second scan line SL2 and may electrically connect the first gate electrode and the second electrode of the first transistor T1 to each other to diode-connect the first transistor T1.

The fourth transistor T4 may be a first initialization transistor that initializes the first gate electrode of the first transistor T1. A fourth gate electrode (or a fourth control electrode) of the fourth transistor T4 may be electrically connected to the previous scan line SLp. A first electrode of the fourth transistor T4 may be electrically connected to the initialization voltage line VIL. A second electrode of the fourth transistor T4 may be electrically connected to the lower electrode CE1 of the storage capacitor Cst, the first electrode of the third transistor T3, and the first gate electrode of the first transistor T1. One of the first and second electrodes of the fourth transistor T4 may be a source electrode, and another one of the first and second electrodes of the fourth transistor T4 may be a drain electrode. The fourth transistor T4 may be turned on in response to the previous scan signal Sn−1 received through the previous scan line SLp and may perform an initialization operation of initializing a voltage of the first gate electrode of the first transistor T1 by transmitting the initialization voltage Vint to the first gate electrode of the first transistor T1.

The fifth transistor T5 may be an operation control transistor. A fifth gate electrode (or a fifth control electrode) of the fifth transistor T5 may be electrically connected to the emission control line EL, a first electrode of the fifth transistor T5 may be electrically connected to the driving voltage line PL, and a second electrode of the fifth transistor T5 may be electrically connected to the first electrode of the first transistor T1 and the second electrode of the second transistor T2. One of the first and second electrodes of the fifth transistor T5 may be a source electrode, and another one of the first and second electrodes of the fifth transistor T5 may be a drain electrode.

The sixth transistor T6 may be an emission control transistor. A sixth gate electrode (or a sixth control electrode) of the sixth transistor T6 may be electrically connected to the emission control line EL, a first electrode of the sixth transistor T6 may be electrically connected to the second electrode of the first transistor T1 and the second electrode of the third transistor T3, and a second electrode of the sixth transistor T6 may be electrically connected to a second electrode of the seventh transistor T7 and the pixel electrode of the organic light-emitting diode OLED. One of the first and second electrodes of the sixth transistor T6 may be a source electrode, and another one of the first and second electrodes of the seventh transistor T7 may be a drain electrode.

The fifth transistor T5 and the sixth transistor T6 may be simultaneously turned on in response to the emission control signal En received through the emission control line EL, the first power voltage ELVDD may be transmitted to the organic light-emitting diode OLED, and the driving current $I_d$ may flow in the organic light-emitting diode OLED.

The seventh transistor T7 may be a second initialization transistor that initializes the pixel electrode of the organic light-emitting diode OLED. A seventh gate electrode (or a seventh control electrode) of the seventh transistor T7 may be electrically connected to the next scan line SLn. A first electrode of the seventh transistor T7 may be electrically connected to the initialization voltage line VIL. A second electrode of the seventh transistor T7 may be electrically connected to the second electrode of the sixth transistor T6 and the pixel electrode of the organic light-emitting diode OLED. The seventh transistor T7 may be turned on in response to the next scan signal Sn+1 received through the next scan line SLn and may initialize the pixel electrode of the organic light-emitting diode OLED. FIG. 4B illustrates that the seventh transistor T7 may be electrically connected to the next scan line SLn. However, according to another embodiment, the seventh transistor T7 may be electrically connected to the emission control line EL and may be driven according to the emission control signal En.

The storage capacitor Cst may include the lower electrode CE1 and an upper electrode CE2. The lower electrode CE1 of the storage capacitor Cst may be electrically connected to the first gate electrode of the first transistor T1, and the upper electrode CE2 of the storage capacitor Cst may be electrically connected to the driving voltage line PL. The storage capacitor Cst may store a charge corresponding to a difference between a voltage of the first gate electrode of the first transistor T1 and the first power voltage ELVDD.

The boost capacitor Cbt may include a third electrode CE3 and a fourth electrode CE4. The third electrode CE3 may be electrically connected to the second gate electrode of the second transistor T2 and the first scan line SL1, and the fourth electrode CE4 may be electrically connected to the first node N1. In case that the first scan signal Sn supplied through the first scan line SL1 is turned off, the boost capacitor Cbt may increase a voltage of the first node N1, and in case that the voltage of the first node N1 is increased, a black gradation may be vividly displayed.

According to an embodiment, FIG. 4B illustrates that the third and fourth transistors T3 and T4 are NMOS transistors, and the first, second, and fifth to seventh transistors T1, T2, T5 to T7 are PMOS transistors. The first transistor T1, which may directly affect a brightness of the display panel 10, may include a semiconductor layer including polycrystalline silicon having a high reliability, and a display apparatus having a high resolution may be realized.

An oxide semiconductor may have a high carrier mobility and a low leakage current, and even in case that a driving time is increased, a voltage drop may not be significant. For example, even during low frequency driving, a color change of an image due to a voltage drop may be insignificant. Accordingly, low frequency driving may be possible. As described above, the oxide semiconductor may have the low leakage current, and at least one of the third transistor T3 and the fourth transistor T4 electrically connected to the gate electrode of the first transistor T1 may include the oxide semiconductor, in order to prevent flowing of the leakage current to the first gate electrode of the first transistor T1 and also to reduce power consumption.

Figure 5:
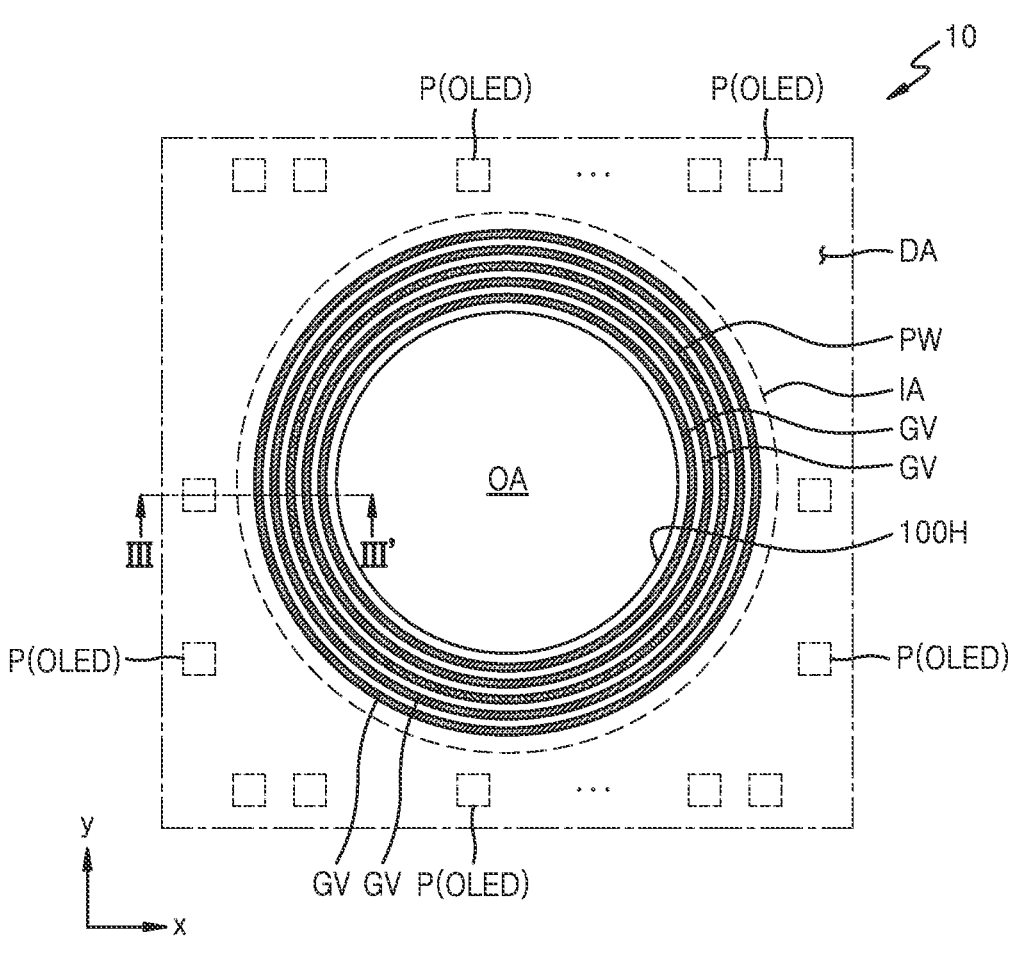
FIG. 5 is a schematic plan view of a portion of a display panel in accordance with an embodiment.

FIG. 5 is a schematic plan view of a portion of a display panel 10 according to an embodiment.

Pixels P may be arranged in the display area DA, and the intermediate area IA may be arranged between the opening area OA and the display area DA. The pixels P may be arranged in the display area DA and surround the opening area OA and the intermediate area IA.

A position of the pixel P may correspond to a position of an organic light-emitting diode OLED. That the pixel P is arranged in the display area DA may indicate that the organic light-emitting diode OLED is arranged in the display area DA.

The pixels P arranged adjacent to the opening area OA may be spaced apart from each other with the opening area OA interposed between the pixels P in a plan view. The pixels P may be spaced apart from each other in an upper or lower direction with respect to the opening area OA or in a left or right direction with respect to the opening area OA.

Grooves GV of an organic insulating layer (see, e.g., OL of FIG. 6) may be arranged in the intermediate area IA and be spaced apart from each other in the x and/or y directions. Each groove GV may have a closed-loop shape in a plan view (for example, when viewed in a direction approximately perpendicular to an upper surface of a substrate (see, e.g., 100 of FIG. 6)). According to embodiment, the grooves GV may form a concentric circle as illustrated in FIG. 5. Detailed descriptions thereof are given below with reference to FIGS. 6, 7A, and 7B.

At least one partition wall PW may be arranged in the intermediate area IA. The partition wall PW may have a closed-loop shape in a plan view. According to an embodiment, FIG. 5 illustrates that one partition wall (or bank) PW may be arranged in the intermediate area IA. However, according to another embodiment, two partition walls PW may be arranged in the intermediate area IA and be spaced apart from each other.

The grooves GV may be arranged between the display area DA and the partition wall PW and/or between the partition wall PW and the opening area OA. According to an embodiment, FIG. 5 illustrates that two grooves GV may be arranged between the display area DA and the partition wall PW, and two grooves GV may be arranged between the partition wall PW and the opening area OA. However, the disclosure is not limited thereto. According to another embodiment, three or more grooves GV may be arranged between the display area DA and the partition wall PW. Three or more grooves GV may be arranged between the partition wall PW and the opening area OA.

A substrate (see, e.g., 100 of FIG. 6) of the display panel 10 may include a via-hole 100H corresponding to the opening area OA, and opening area OA may correspond to the via-hole 100H of the substrate. For example, that the grooves GV may be arranged between the partition wall PW and the opening area OA may indicate that the grooves GV may be arranged between the partition wall PW and the via-hole 100H.

Figure 6:
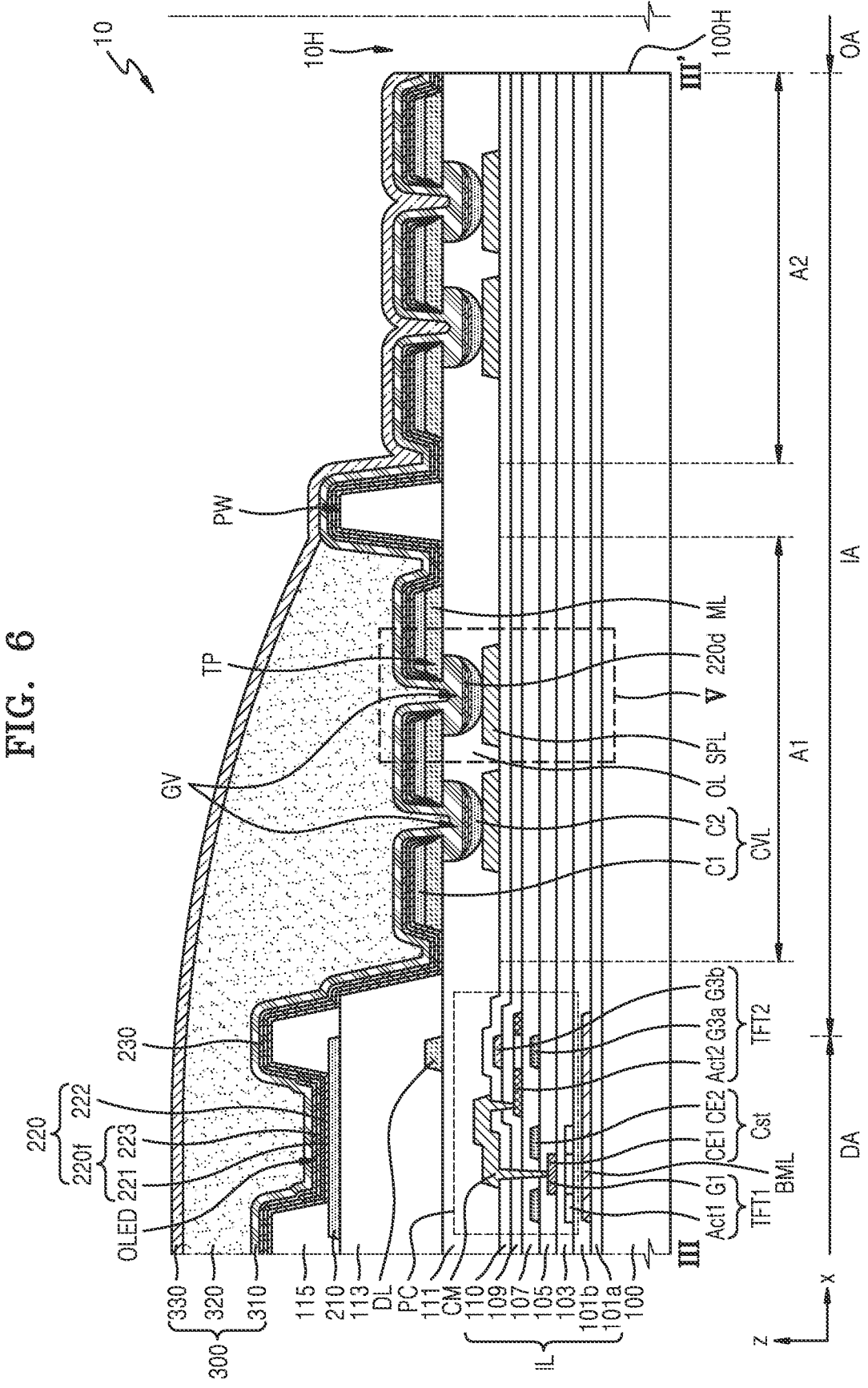
FIG. 6 is a schematic cross-sectional view of a portion of a display panel taken along line III-III' of FIG. 5 in accordance with an embodiment.
Figure 7A:
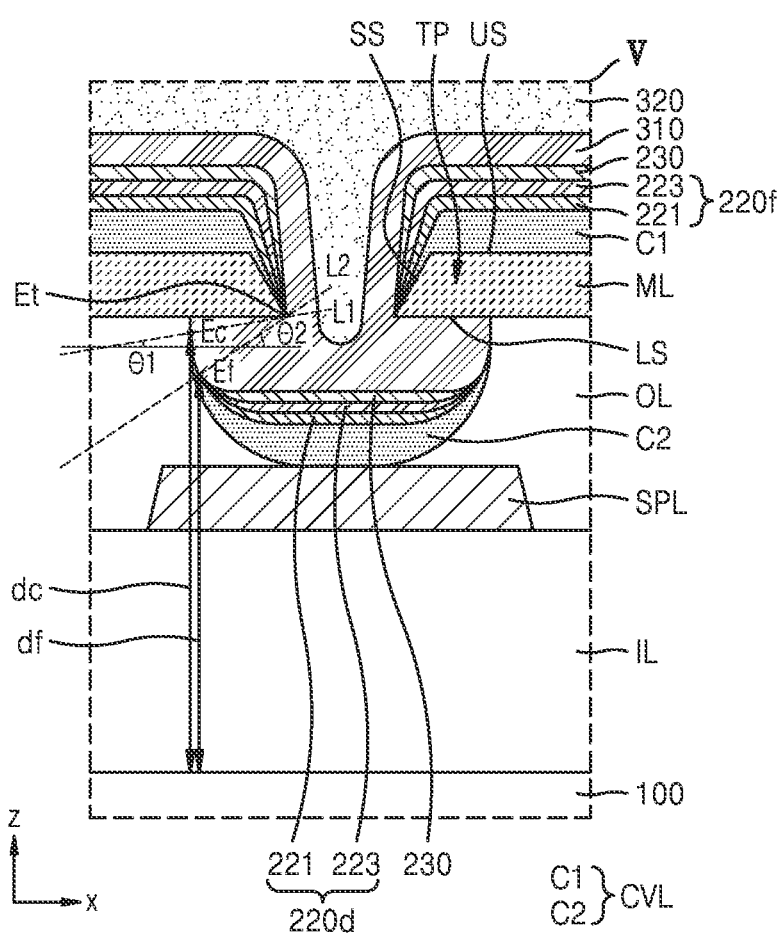
FIG. 7A is a schematic cross-sectional view of a portion of a display panel in accordance with an embodiment and schematically indicate enlarged region V of FIG. 6.

FIG. 6 is a schematic cross-sectional view of a portion of the display panel 10 taken along line III-III' of FIG. 5 in accordance with an embodiment, and FIG. 7A is a schematic cross-sectional view of a portion of the display panel 10 in accordance with an embodiment and schematically illustrates region V of FIG. 6.

FIG. 7A schematically illustrates structures of the groove GV, a support layer SPL, a metal layer ML, a cover layer CVL, and the like arranged in a first area A1 between the display area DA and the partition wall PW. However, the groove GV, the support layer SPL, the metal layer ML, and the cover layer CVL arranged in a second area A2 between the partition wall PW and the opening area OA may have same structures.

Referring to FIG. 6, the display panel 10 may include the display area DA, the opening area OA, and the intermediate area IA between the opening area OA and the display area DA. The display panel 10 may include the substrate 100 on which elements of the display panel 10 are arranged, and the substrate 100 may include the display area DA, the opening area OA, and the intermediate area IA between the opening area OA and the display area DA.

A pixel circuit PC may be arranged in the display area DA of the substrate 100, and an organic light-emitting diode OLED electrically connected to the pixel circuit PC may be arranged on the pixel circuit PC.

The substrate 100 may include glass materials, polymer resins, or the like. For example, the substrate may include polymer resins including polyether sulfone, polyacrylate, polyether imide, polyethylene naphthalate, polyethylene terephthalate, polyphenylene sulfide, polyarylate, polyimide, polycarbonate, cellulose acetate propionate, the like, or a combination thereof. The substrate 100 including the polymer resins may be flexible, rollable, foldable, or bendable. The substrate 100 may have multi-layered structure including a layer including polymer resins and an inorganic layer (not shown).

A first buffer layer 101a and a second buffer layer 101b may be arranged on an upper surface of the substrate 100. The first buffer layer 101a and the second buffer layer 101b may prevent a penetration of impurities into a first semiconductor layer Act1 of the pixel circuit PC. The first and second buffer layers 101a and 101b may include an inorganic insulating material, such as silicon nitride, silicon oxynitride, silicon oxide, the like, or a combination thereof, and may include a single layer or multi-layer including an inorganic insulating material.

A bottom metal layer BML may be arranged between the first and second buffer layers 101a and 101b. The bottom metal layer BML may block external light from reaching a first thin-film transistor TFT1 and/or a second thin-film transistor TFT2. According to an embodiment, a constant voltage or signal may be applied to the bottom metal layer BML and prevent damage to the pixel circuit PC due to an electrostatic discharge. FIG. 6 illustrates that one bottom metal layer BML may be arranged below the pixel circuit PC. However, the disclosure is not limited thereto, and according to another embodiment, the display panel 10 may include multiple bottom metal layers BML. The bottom metal layer BML may include a metal. For example, the bottom metal layer BML may include Al, Pt, Pd, Ag, Mg, Au, Ni, Nd, Ir, Cr, Ca, Mo, Ti, W, Cu, the like, or an alloy thereof and may include a single layer or multi-layer.

The pixel circuit PC may be arranged on the second buffer layer 101b. The pixel circuit PC may include multiple transistors and a storage capacitor Cst. According to an embodiment, the pixel circuit PC may include a first thin-film transistor TFT1 and a second thin-film transistor TFT2.

The first thin-film transistor TFT1 may include the first semiconductor layer Act1 on the second buffer layer 101b and a first gate electrode G1 overlapping a channel area of the first semiconductor layer Act1 in a plan view. The first semiconductor layer Act1 may include a silicon-based semiconductor material, for example, polysilicon or the like. The first semiconductor layer Act1 may include a channel area and impurity areas arranged at sides of the channel area. One of the impurity areas arranged at a side of the channel area may be a source area, and another one of the impurity areas arranged at another side of the channel area may be a drain area.

A first gate insulating layer 103 may be arranged between the first semiconductor layer Act1 and the first gate electrode G1. The first gate insulating layer 103 may include an inorganic insulating material, such as silicon oxide, silicon nitride, silicon oxynitride, the like, or a combination thereof, and may have a single-layered or multi-layered structure.

The first gate electrode G1 may include a conductive material including Mo, Al, Cu, Ti, the like, or a combination thereof and may have a single-layered or multi-layered structure.

The storage capacitor Cst may include a lower electrode CE1 and an upper electrode CE2 overlapping each other in a plan view. According to an embodiment, the lower electrode CE1 of the storage capacitor Cst may include the first gate electrode G1 of the first thin-film transistor TFT1. For example, the first gate electrode GE1 of the first thin-film transistor TFT1 may be integral with the lower electrode CE1 of the storage capacitor Cst.

The upper electrode CE2 of the storage capacitor Cst may include a conductive material such as Mo, Al, Cu, Ti, the like, or an alloy thereof and may have a single-layered or multi-layered structure.

A first interlayer insulating layer 105 may be arranged between the lower electrode CE1 and the upper electrode CE2 of the storage capacitor Cst, and a second interlayer insulating layer 107 may be arranged on the upper electrode CE2 of the storage capacitor Cst. Each of the first and second interlayer insulating layers 105 and 107 may include an inorganic insulating material, such as silicon oxide, silicon nitride, silicon oxynitride, the like, or a combination thereof, and may have a single-layered or multi-layered structure.

A second semiconductor layer Act2 of the second thin-film transistor TFT2 may be arranged on the second interlayer insulating layer 107. The second semiconductor layer Act2 may include an oxide-based semiconductor material. For example, the second semiconductor layer Act2 may include a Zn oxide-based material, for example, a Zn oxide, an In—Zn oxide, a Ga—In—Zn oxide, the like, or a combination thereof. According to an embodiment, the second semiconductor layer Act2 may include a semiconductor including In—Ga—Zn—O (IGZO), In—Sn—Zn—O (ITZO), In—Ga—Sn—Zn—O (IGTZO), or the like, in which a metal, such as In, Ga, Sn, the like, or an alloy thereof, is included in ZnO.

According to an embodiment, the second thin-film transistor TFT2 may have a dual-gate structure including a lower gate electrode G3a and an upper gate electrode G3b overlapping a channel area of the second semiconductor layer Act2 in a plan view. According to another embodiment, the lower gate electrode G3a may be omitted.

The lower gate electrode G3a and the upper electrode CE2 of the storage capacitor Cst may be arranged on a same layer. For example, the lower gate electrode G3a may be arranged between the first interlayer insulating layer 105 and the second interlayer insulating layer 107. The lower gate electrode G3a and the upper electrode CE2 of the storage capacitor Cst may include a same material.

The upper gate electrode G3b may be arranged on the second semiconductor layer Act2 with a second gate insulating layer 109 interposed between the second semiconductor layer Act2 and the upper gate electrode G3b. The upper gate electrode G3b may include a conductive material such as Mo, Al, Cu, Ti, the like, or an alloy thereof and may have a single-layered or multi-layered structure. The second gate insulating layer 109 may include an inorganic insulating material, such as silicon oxide, silicon nitride, silicon oxynitride, the like, or a combination thereof, and may have a single-layered or multi-layered structure.

A third interlayer insulating layer 110 may be arranged on the upper gate electrode G3b. The third interlayer insulating layer 119 may include an inorganic insulating material, such as silicon oxide, silicon nitride, silicon oxynitride, the like, or a combination thereof, and may have a single-layered or multi-layered structure.

FIG. 6 illustrates that the upper electrode CE2 of the storage capacitor Cst and the lower gate electrode G3a of the second thin-film transistor TFT2 may be arranged on a same layer. However, the disclosure is not limited thereto. According to another embodiment, the upper electrode CE2 of the storage capacitor Cst and the second semiconductor layer Act2 of the second thin-film transistor TFT2 may be arranged on a same layer.

The first thin-film transistor TFT1 and the second thin-film transistor TFT2 may be electrically connected to each other through a connection electrode CM. The connection electrode CM may be arranged on the third interlayer insulating layer 110. A side of the connection electrode CM may be electrically connected to the first gate electrode G1 of the first thin-film transistor TFT1, and another side of the connection electrode CM may be electrically connected to the second semiconductor layer Act2 of the second thin-film transistor TFT2.

The connection electrode CM may include a conductive material such as Mo, Al, Cu, Ti, the like, or an alloy thereof and may have a single-layered or multi-layered structure. For example, the connection electrode CM may have a multi-layered structure including Ti/Al/Ti layers.

A first planarization layer 111 may be arranged on the connection electrode CM. According to an embodiment, the first planarization layer 111 may include an organic insulating material. In an embodiment, the first planarization layer 111 may include an acrylic material, benzocyclobutene (BCB), polyimide, hexamethyldisiloxane (HMDSO), the like, or a combination thereof.

Signal lines, such as a data line DL or the like, may be arranged on the first planarization layer 111 and may be covered by a second planarization layer 113. FIG. 6 illustrates that the data line DL may be formed on the first planarization layer 111. However, the disclosure is not limited thereto. The data line DL and the connection electrode CM may be arranged on a same layer, for example, on the third interlayer insulating layer 110.

The data line DL may include a conductive material such as Mo, Al, Cu, Ti, the like, or an alloy thereof and may have a single-layered or multi-layered structure. For example, the data line DL may have a multi-layered structure including Ti/Al/Ti layers.

The second planarization layer 113 may include an organic insulating layer. In an embodiment, the second planarization layer 113 may include an acrylic material, BCB, polyimide, HMDSO, the like, or a combination thereof.

The organic light-emitting diode OLED may include a pixel electrode 210, an intermediate layer 220 on the pixel electrode 210, and an opposite electrode 230 on the intermediate layer 220.

The pixel electrode 210 may be arranged on the second planarization layer 113. The pixel electrode 210 may include a reflective layer (not shown) including Ag, Mg, Al, Pt, Pd, Au, Ni, Nd, Ir, Cr, the like, or an alloy thereof. According to an embodiment, the pixel electrode 210 may further include a conductive oxide layer (not shown) arranged on and/or below the reflection layer. The conductive oxide layer may include indium tin oxide (ITO), indium zinc oxide (IZO), zinc oxide (ZnO), indium oxide ($In_2O_3$), indium gallium oxide (IGO), aluminum zinc oxide (AZO), the like, or a combination thereof. According to an embodiment, the pixel electrode 210 may have a tri-layered structure of ITO/Ag/ITO layers.

An edge of the pixel electrode 210 may overlap a bank layer 115 in a plan view. The bank layer 115 may include a pixel opening overlapping a portion of the pixel electrode 210 in a plan view. The bank layer 115 may include an organic insulating material, such as an acrylic material, BCB, polyimide, HMDSO, the like, or a combination thereof. According to an embodiment, the bank layer 115 may include a light-shielding material. The light-shielding material may include a resin or paste including carbon black, a carbon nano-tube, and a black dye, a metal particle, such as Ni, Al, Mo, the like, and an alloy thereof, a metal oxide particle (for example, chromium oxide or the like), a metal nitride particle (for example, chromium nitride or the like), the like, or a combination thereof.

The intermediate layer 220 may include an emission layer 222 overlapping the pixel electrode 210 through an emission opening of the bank layer 115 in a plan view. The emission layer 222 may include a high molecular-weight or low molecular-weight organic material emitting red, green, or blue light. According to an embodiment, the emission layer 222 may include an inorganic material, quantum dots, the like, or a combination thereof.

The intermediate layer 220 may include a first functional layer 221 and/or a second functional layer 223. The first functional layer 221 may include a hole transport layer (HTL), a hole injection layer (HIL), and/or the like. The second functional layer 223 may include an electron transport layer (ETL), an electron injection layer (EIL), and/or the like.

According to an embodiment, the emission layer 222 may be patterned corresponding to the pixel electrode 210, and the first functional layer 221 and/or the second functional layer 223 may be integrally provided throughout a surface (e.g., an entire surface) of the display area DA. The first functional layer 221 and the second functional layer 223 may extend to the intermediate area IA.

The opposite electrode 230 may include a conductive material having a low work function. For example, the opposite electrode 230 may include a (semi-) transparent layer (not shown) including Ag, Mg, Al, Pt, Pd, Au, Ni, Nd, Ir, Cr, Li, Ca, the like, or an alloy thereof. According to an embodiment, the opposite electrode 230 may further include a layer including a material, such as ITO, IZO, ZnO, $In_2O_3$, the like, or a combination thereof, on the (semi-) transparent layer.

An encapsulation layer 300 may be arranged on the organic light-emitting diode OLED and may encapsulate the organic light-emitting diode OLED. The encapsulation layer 300 may include an inorganic encapsulation layer, an organic encapsulation layer, the like, or a combination thereof. According to an embodiment, FIG. 6 illustrates that the encapsulation layer 300 may include a first inorganic encapsulation layer 310, a second inorganic encapsulation layer 330, and an organic encapsulation layer 320 between the second inorganic encapsulation layer 330 and the first inorganic encapsulation layer 310.

The first and second inorganic encapsulation layers 310 and 330 may include at least one inorganic material of aluminum oxide ($Al_2O_3$), titanium oxide (TiO), tantalum oxide ($TA_2O_5$), hafnium oxide ($HfO_2$), ZnO, $SiO_x$, $SiN_x$, and SiON. The first and second inorganic encapsulation layers 310 and 330 may include a single layer or multi-layers.

The organic encapsulation layer 320 may include a polymer-based material. According to an embodiment, the organic encapsulation layer 320 may include an acryl-based resin, an epoxy-based resin, polyimide, polyethylene, the like, or a combination thereof. According to an embodiment, the organic encapsulation layer 320 may include acrylate or the like.

Insulating layers including an inorganic insulating material, stacked on the substrate 100, may be an inorganic insulating layer IL. According to an embodiment, referring to FIG. 6, the inorganic insulating layer IL may include the first buffer layer 101a to the third interlayer insulating layer 110. However, the disclosure is not limited thereto. According to another embodiment, some of the first buffer layer 101a, the second buffer layer 101b, the first gate insulating layer 103, the first interlayer insulating layer 105, the second interlayer insulating layer 107, the second gate insulating layer 109, and the third interlayer insulating layer 110 may be omitted.

In FIG. 6, in the intermediate area IA, the display panel 10 according to an embodiment may include the substrate 100, the inorganic insulating layer IL, the support layer SPL, the organic insulating layer OL including the grooves GV, the metal layer ML, and the cover layer CVL.

An edge of the second planarization layer 113 may be arranged in the intermediate area IA. For example, the edge of the second planarization layer 113 may be arranged between the display area DA and a groove GV arranged most adjacent to the display area DA. The intermediate area IA may include the first area A1 that is from the edge of the second planarization layer 113 to the partition wall PW and the second area A2 that is from the partition wall PW to the via-hole 100H.

At least a portion of the inorganic insulating layer IL of the display area DA may extend toward the via-hole 100H of the substrate 100. For example, at least a portion of the inorganic insulating layer IL may be arranged in the display area DA and the intermediate area IA. For example, an edge of the inorganic insulating layer IL toward the opening area OA and an edge of the substrate 100 defining the via-hole 100H may be arranged on substantially a same vertical line.

The support layer SPL may be arranged on the inorganic insulating layer IL. The support layer SPL may include multiple support layers SPL spaced apart from each other in the x and/or y directions. The support layer SPL may include a metal. The support layer SPL may include a conductive material such as Mo, Al, Cu, Ti, the like, or an alloy thereof and may have a single-layered or multi-layered structure. For example, the support layer SPL may have a multi-layered structure of Ti/Al/Ti layers.

The support layer SPL and a line arranged on an insulating layer covering a gate electrode of a transistor arranged in the display area DA may be formed by a same process, may be arranged on a same layer, and may include a same material. For example, the support layer SPL and the connection electrode CM arranged on the third interlayer insulating layer 110 covering the upper gate electrode G3b of the second thin-film transistor TFT2 may be arranged on a same layer and may include a same material.

A thickness of the support layer SPL may be in a range of about 30% to about 80% of a thickness of the organic insulating layer OL. According to an embodiment, a thickness of the support layer SPL may be in a range of about 3 μm to about 10 μm. According to an embodiment, a thickness of the support layer SPL may be in a range of about 5 μm to about 8 μm.

The organic insulating layer OL may be arranged on the inorganic insulating layer IL. For example, the organic insulating layer OL may be arranged on the third interlayer insulating layer 110. The organic insulating layer OL may cover at least a portion of the support layer SPL. The organic insulating layer OL may cover at least a portion of a side surface of the support layer SPL. According to an embodiment, a thickness of the organic insulating layer OL may be in a range of about 5 μm to about 20 μm. According to an embodiment, a thickness of the organic insulating layer OL may be in a range about 9 μm to about 13 μm. The organic insulating layer OL and the first planarization layer 111 covering the connection electrode CM may be formed by a same process. The organic insulating layer OL and the first planarization layer 111 may include a same material and may be arranged on a same layer. The organic insulating layer OL and the first planarization layer 111 may be connected to each other.

The organic insulating layer OL may include the grooves GV. The groove GV may be formed by removing a portion of the organic insulating layer OL in a thickness direction of the display panel 10 (e.g., a z direction). The z direction may intersect the x direction and the y direction. Through the groove GV, the organic insulating layer OL may expose at least a portion of an upper surface of the support layer SPL. A depth of the groove GV may correspond to a depth obtained by subtracting the thickness of the support layer SPL from the thickness of the organic insulating layer OL.

The metal layer ML may be arranged on the organic insulating layer OL. The metal layer ML may include a protrusion tip TP. The protrusion tip TP may be a portion of the metal layer ML, and the portion may protrude toward the groove GV. The protrusion tip TP may be a portion of the metal layer ML and may not contact the organic insulating layer OL. The protrusion tip TP may overlap the groove GV in a plan view.

The metal layer ML and the data line DL may be formed by a same process. The metal layer ML and the data line DL may be arranged on a same layer and may include a same material. The metal layer ML may include a conductive material such as Mo, Al, Cu, Ti, the like, or an alloy thereof and may have a single-layered or multi-layered structure. For example, the metal layer ML may have a multi-layered structure of Ti/Al/Ti.

The display panel 10 according to an embodiment may include the support layer SPL arranged on the inorganic insulating layer IL and the organic insulating layer OL covering the inorganic insulating layer IL and at least a portion of a side surface of the support layer SPL and exposing at least a portion of an upper surface of the support layer SPL through the grooves GV.

In an ashing process after the metal layer ML is formed, the organic insulating layer OL may be separated by removing only a portion of the thickness of the organic insulating layer OL. By providing the support layer SPL, the organic insulating layer OL may be disconnected by removing only a portion of the thickness of the organic insulating layer OL, other than the thickness of the support layer SPL. Thus, ashing time may be reduced.

Also, by reducing the ashing time, a length of the protrusion tip TP of the metal layer ML may be reduced. The length of the protrusion tip TP may be reduced to in a range of about 0.1 μm to about 0.5 μm. As the length of the protrusion tip TP is reduced, the number of protrusion tips TP in a same area may be correspondingly increased. Accordingly, a reliability of a display apparatus may be improved, and a dead space may be reduced. The cover layer CVL may be arranged on the metal layer ML. The cover layer CVL may cover an upper surface (see, e.g., US of FIGS. 7A and 7B) and a side surface (see, e.g., SS of FIGS. 7A and 7B) of the metal layer ML. The cover layer CVL may cover a portion of the organic insulating layer OL. The cover layer CVL may be arranged in the groove GV.

The cover layer CVL may include a first cover portion C1 covering the upper surface US and the side surface SS of the metal layer ML and a second cover portion C2 arranged in the groove GV. In case that the display panel includes multiple metal layers ML, the first cover portion C1 may cover a side surface of each of the metal layers ML. The second cover portion C2 may contact a portion of the upper surface of the support layer SPL and a portion of a side surface of the organic insulating layer OL defining the groove GV. The first cover portion C1 and the second cover portion C2 may be spaced apart from each other.

The cover layer CVL may include a metal. The cover layer CVL and the pixel electrode 210 may include a same material. The cover layer CVL and the pixel electrode 210 may be formed by a same process. According to an embodiment, the cover layer CVL may have a tri-layered structure of ITO/Ag/ITO layers.

A functional layer 220f of the intermediate layer 220 in the display area DA may extend to the intermediate area IA. The functional layer 220f may include the first functional layer 221 and/or the second functional layer 223. The functional layer 220f may be arranged on the cover layer CVL in the intermediate area IA. A dummy functional layer 220d detached from the functional layer 220f by the protrusion tip TP may be arranged in the groove GV. The dummy functional layer 220d may be spaced apart from the functional layer 220f. The functional layer 220f including an organic material may be separated in the intermediate layer IA by the structures of the groove GV, and impurities, such as water or the like, introduced through the via-hole 100H of the substrate 100, may be prevented from flowing into the organic light-emitting diode OLED through the functional layer 220f.

FIG. 7A schematically illustrates an arrangement of the second cover portion C2 of the cover layer CVL and the dummy functional layer 220d, by enlarging region V of FIG. 6. The dummy functional layer 220d may be arranged on the second cover portion C2.

Referring to FIG. 7A, a first distance de from an upper surface of the substrate 100 to an edge Ec of the second cover portion C2 may be greater than a second distance df from an upper surface of the substrate 100 to an edge Ef of the dummy functional layer 220d. For example, the edge Ec of the second cover portion C2 may be arranged farther from the substrate 100 than the edge Ef of the dummy functional layer 220d. The second cover portion C2 may cover the groove (see, e.g., GV of FIG. 6) by a greater area than the dummy functional layer 220d.

With respect to a relationship with the protrusion tip TP, a vertical distance between the edge Ec of the second cover portion C2 and a lower surface LS of the protrusion tip TP may be less than a vertical distance between the edge Ef of the dummy functional layer 220d and the lower surface LS of the protrusion tip TP.

A first angle θ1 formed by a virtual line L1 extending from the edge Ec of the second cover portion C2 to an edge Et of the protrusion tip TP with the upper surface of the substrate 100 may be less than a second angle θ2 formed by a virtual line L2 extending from the edge Ef of the dummy functional layer 220d to the edge Et of the protrusion tip TP with the upper surface of the substrate 100.

The dummy functional layer 220d may expose the edge Ec of the second cover portion C2. The relationship between the second cover portion C2 of the cover layer CVL and the dummy functional layer 220d may be due to a difference in step coverage between the cover layer CVL and the functional layer 220f. The step coverage may denote a deposition capacity on a portion having a step difference. The difference in step coverage may be affected by a difference between materials included in the cover layer CVL and the functional layer 220f.

According to an embodiment, the step coverage of the cover layer CVL may be greater than the step coverage of the functional layer 220f. The second cover portion C2 may cover the side surface of the organic insulating layer OL defining the groove (see, e.g., GV of FIG. 6) by a greater area than the dummy functional layer 220d. The dummy functional layer 220f may not contact the organic insulating layer OL. The organic insulating layers OL adjacent to a groove GV may be disconnected from the dummy functional layer 220f. Thus, a penetration path of oxygen or the like into the organic light-emitting diode OLED may be blocked.

The second cover portion C2 may expose at least a portion of the organic insulating layer OL. The second cover portion C2 may expose a portion of the side surface of the organic insulating layer OL arranged adjacent to the metal layer ML among the side surface defining the groove GV. In case that heat is applied in a subsequent process after the organic insulating layer OL and the second cover portion C2 are formed, moisture existing in the organic insulating layer OL may burst in case that the moisture is not outgassed. According to an embodiment, the second cover portion C2 may expose at least a portion of the organic insulating layer OL, and an outgassing path of moisture may be obtained.

Figure 7B:
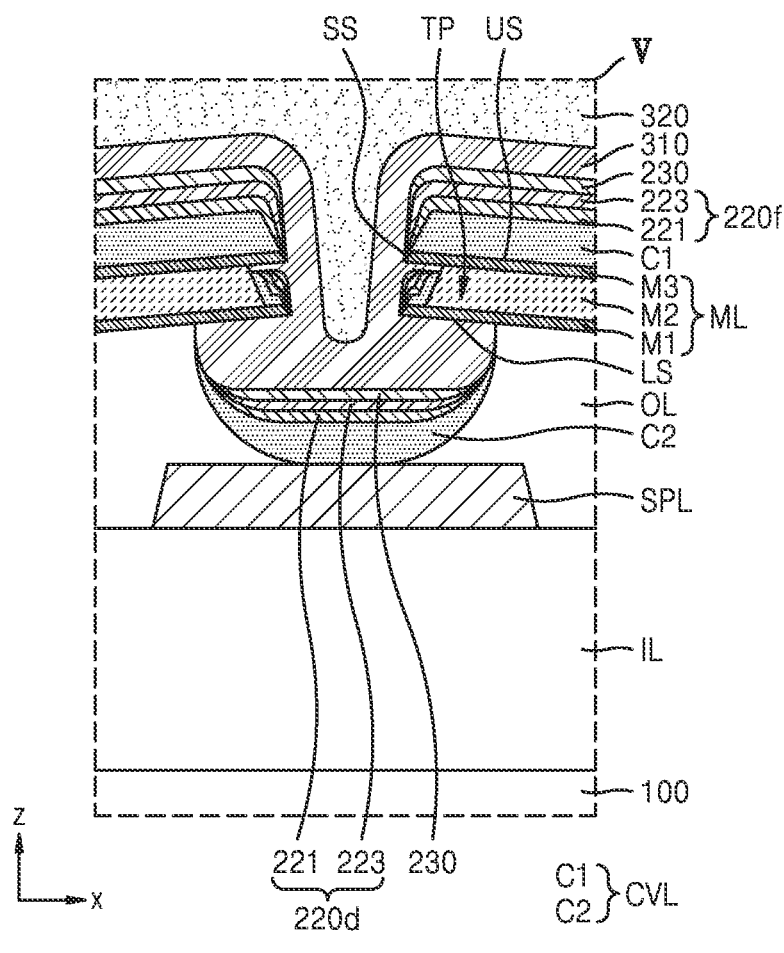
FIG. 7B is a schematic cross-sectional view of a portion of a display panel in accordance with an embodiment and schematically indicate enlarged region V of FIG. 6.

FIG. 7B is a schematic cross-sectional view of a portion of a display panel 10 in accordance with an embodiment and schematically illustrates region V of FIG. 6.

Referring to FIG. 7B, the metal layer ML may not be parallel to an upper surface of the substrate 100. The support layer SPL may be arranged on only a portion of the organic insulating layer IL, and an upper surface of the organic insulating layer OL covering the support layer SPL and the inorganic insulating layer IL may have a slope. An end of the metal layer ML arranged on the organic insulating layer OL and overlapping the support layer SPL in a z direction, may have an ascending slope in the z direction. The first cover portion C1 of the cover layer CVL arranged on the metal layer ML, the functional layer 220f, the opposite electrode 230, and the metal layer ML may have a same slope.

The metal layer ML may include a conductive material such as Mo, Al, Cu, Ti, the like, or an alloy thereof and may have a single-layered or multi-layered structure. According to an embodiment, the metal layer ML may have a multi-layered structure including a first layer M1, a second layer M2, and a third layer M3. The first layer M1 and the third layer M3 may include Ti or the like, and the second layer M2 may include Al or the like. The protrusion tip TP of the metal layer ML may extend more in the first layer M1 and the third layer M3 than in the second layer M2.

According to an embodiment, the first cover portion C1 of the cover layer CVL may cover the upper surface US and the side surface SS of the metal layer ML. The side surface SS of the metal layer ML may include a side surface of the first layer M1, a side surface of the second layer M2, and a side surface of the third layer M3. The first cover portion C1 may extend from the upper surface US of the metal layer ML to the side surface of the third layer M3, the side surface of the second layer M2, and the side surface of the first layer M1. According to an embodiment, as illustrated in FIG. 7B, a portion of the first cover portion C1 may be disconnected at the side surface SS of the metal layer ML. Since the third layer M3 protrudes in a direction toward the groove (see, e.g., GV of FIG. 6) further than the second layer M2, the first cover portion C1 may not be deposited on a lower surface of the third layer M3.

Likewise, portions of the functional layer 220f and the opposite electrode 230 may be disconnected at the side surface SS of the metal layer ML. Not only the functional layer 220f may be disconnected from the dummy functional layer 220d, but also a portion of the functional layer 220f may be disconnected at the side surface SS of the metal layer ML. An introduction of external impurities, such as water or the like, may be further effectively prevented.

FIGS. 8A to 8E are schematic cross-sectional views illustrating a method of manufacturing a display panel 10 according to a process order in accordance with an embodiment.

Figure 8A:
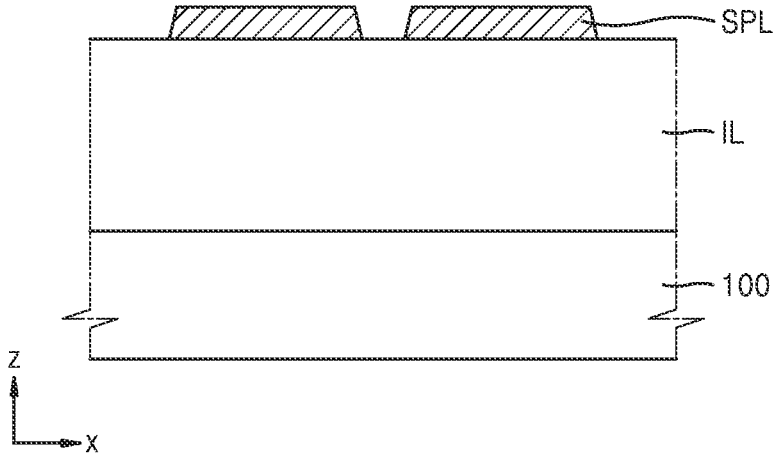
FIGS. 8A to 8E are schematic cross-sectional views illustrating a process of a method of manufacturing a display panel in accordance with an embodiment.

Referring to FIG. 8A, the inorganic insulating layer IL and the support layer SPL may be formed on the substrate 100. The support layer SPL and the connection electrode CM arranged in the display area DA may be simultaneously formed by a same process. The support layer SPL and the connection electrode CM may include a same material.

Figure 8B:
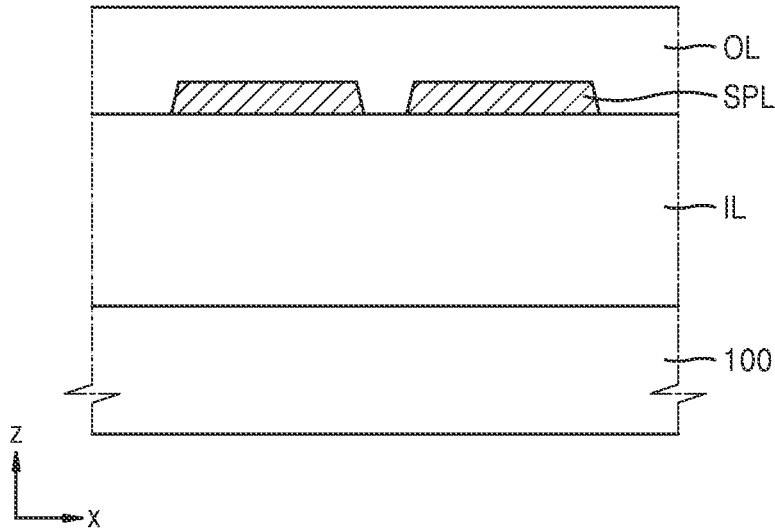

Referring to FIG. 8B, the organic insulating layer OL covering the support layer SPL may be formed on the substrate 100. The organic insulating layer OL may cover the upper surface and the side surface of the support layer SPL. The organic insulating layer OL and the first planarization layer 111 in the display area DA may be simultaneously formed by a same process. The organic insulating layer OL and the first planarization layer 111 may include a same material.

Figure 8C:
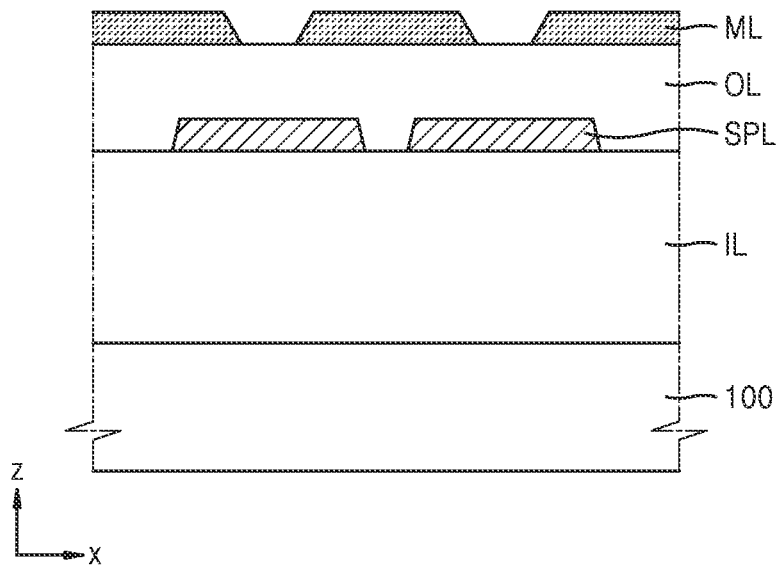

Referring to FIG. 8C, the metal layer ML may be formed on the organic insulating layer OL. The metal layer ML may overlap at least a portion of the support layer SPL in a plan view. The metal layer ML and the data line DL arranged in the display area DA may be simultaneously formed by a same process. The metal layer ML and the data line DL may include a same material.

Figure 8D:
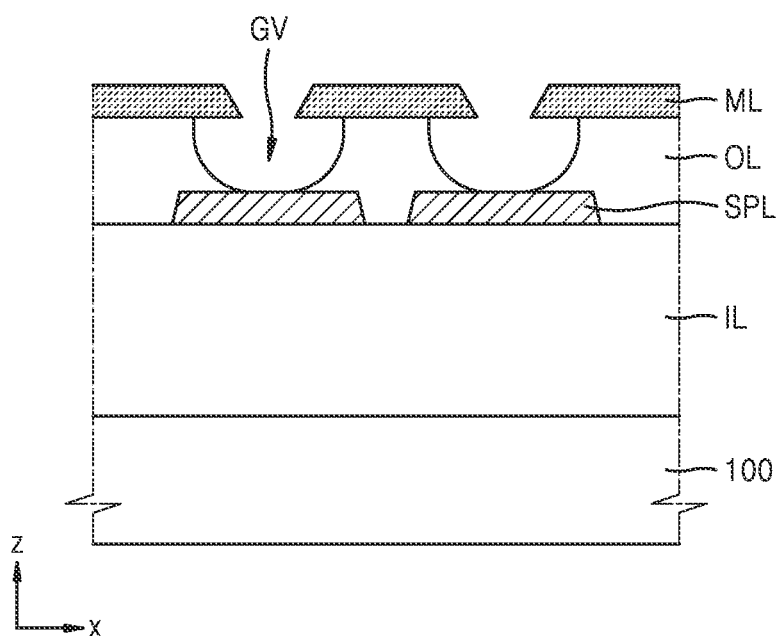

Referring to FIG. 8D, the grooves GV may be formed in the organic insulating layer OL. The groove GV may be formed in a position corresponding to the support layer SPL. The groove GV may expose the upper surface of the support layer SPL. The groove GV may expose a portion of a lower surface of the metal layer ML.

Figure 8E:
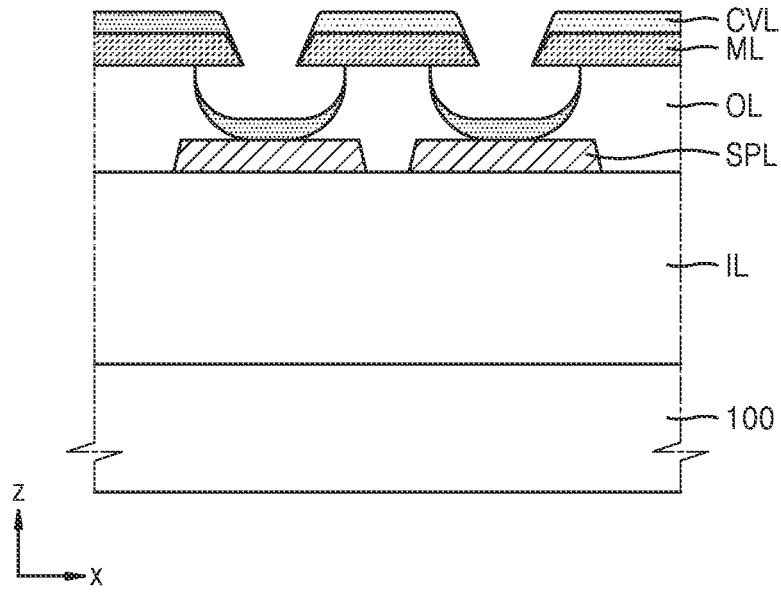

Referring to FIG. 8E, the cover layer CVL covering the upper surface and the side surface of the metal layer ML may be formed. The cover layer CVL may contact the metal layer ML, the support layer SPL, and the organic insulating layer OL. The cover layer CVL and the pixel electrode 210 in the display area DA may be simultaneously formed by a same process. The cover layer CVL and the pixel electrode 210 may include a same material.

The support layer SPL, the organic insulating layer OL, the metal layer ML, and the cover layer CVL arranged in the intermediate area IA and the structures in the display area DA may be respectively formed by a same process, and a process of manufacturing the display panel 10 may become simplified.

As described above, according to embodiments of the disclosure, a display panel 10 including a display area DA in which various types of components are arranged and having improved reliability may be realized. However, the scope of the disclosure is not limited to these effects as described above.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display panel comprising:
an opening area, a display area surrounding at least a portion of the opening area, and an intermediate area between the opening area and the display area in a plan view;
a light-emitting diode arranged on a substrate in the display area and including:
a pixel electrode;
an opposite electrode; and
an intermediate layer arranged between the pixel electrode and the opposite electrode and including a functional layer and an emission layer;
a support layer arranged on the substrate in the intermediate area;
an organic insulating layer arranged on the substrate and the support layer and having a groove corresponding to the support layer;
a metal layer arranged on the organic insulating layer and having a protrusion tip protruding toward the groove; and
a cover layer including:
a first cover portion covering an upper surface and a side surface of the metal layer; and
a second cover portion arranged in the groove,
wherein the functional layer extends to the intermediate area and includes a dummy functional layer arranged on the second cover portion.

2. The display panel of claim 1, wherein the organic insulating layer covers at least a portion of the support layer.

3. The display panel of claim 1, wherein the first cover portion and the second cover portion are spaced apart from each other.

4. The display panel of claim 1, wherein a first distance from an upper surface of the substrate to an edge of the second cover portion is greater than a second distance from the upper surface of the substrate to an edge of the dummy functional layer.

5. The display panel of claim 1, wherein the dummy functional layer exposes an edge of the second cover portion.

6. The display panel of claim 1, wherein the dummy functional layer is spaced apart from the organic insulating layer.

7. The display panel of claim 1, wherein a first angle formed by a first virtual line extending from an edge of the second cover portion to an edge of the protrusion tip with an upper surface of the substrate is less than a second angle formed by a second virtual line extending from an edge of the dummy functional layer to the edge of the protrusion tip with the upper surface of the substrate.

8. The display panel of claim 1, wherein the cover layer and the pixel electrode include a same material.

9. The display panel of claim 1, wherein the support layer includes a metal.

10. The display panel of claim 9, further comprising:
a thin-film transistor arranged in the display area and including a semiconductor layer and a gate electrode,
wherein the support layer and a line arranged on an interlayer insulating layer covering the gate electrode are arranged on a same layer.

11. The display panel of claim 1, further comprising:
an inorganic insulating layer arranged on the substrate and continually extending from the display area to the intermediate area,
wherein the support layer is arranged on the inorganic insulating layer.

12. A display panel comprising:
an opening area, a display area surrounding at least a portion of the opening area, and an intermediate area between the opening area and the display area in a plan view;
a light-emitting diode arranged on a substrate in the display area and including:
a pixel electrode;
an opposite electrode; and
an intermediate layer arranged between the pixel electrode and the opposite electrode and including a functional layer and an emission layer;
an inorganic insulating layer arranged on the substrate and continually extending from the display area to the intermediate area;
a support layer arranged on the inorganic insulating layer in the intermediate area and including a metal;

an organic insulating layer arranged on the inorganic insulating layer and the support layer and having a groove corresponding to the support layer;
a metal layer arranged on the organic insulating layer and having a protrusion tip protruding toward the groove; and
a cover layer including a first cover portion covering an upper surface and a side surface of the metal layer and a second cover portion arranged in the groove,
wherein the cover layer and the pixel electrode include a same material.

13. The display panel of claim 12, wherein the second cover portion exposes at least a portion of the organic insulating layer.

14. The display panel of claim 12, wherein the organic insulating layer covers at least a portion of the support layer.

15. The display panel of claim 12, wherein the functional layer extends to the intermediate area and includes a dummy functional layer arranged on the second cover portion.

16. The display panel of claim 15, wherein the dummy functional layer exposes an edge of the second cover portion.

17. The display panel of claim 15, wherein a first distance from an upper surface of the substrate to an edge of the second cover portion is greater than a second distance from the upper surface of the substrate to an edge of the dummy functional layer.

18. The display panel of claim 15, wherein a first angle formed by a first virtual line extending from an edge of the second cover portion to an edge of the protrusion tip with an upper surface of the substrate is less than a second angle formed by a second virtual line extending from an edge of the dummy functional layer to the edge of the protrusion tip with the upper surface of the substrate.

19. The display panel of claim 12, further comprising:
a thin-film transistor arranged in the display area and including a semiconductor layer and a gate electrode,
wherein the support layer and a line arranged on an interlayer insulating layer covering the gate electrode are arranged on a same layer.

20. The display panel of claim 19, wherein the support layer and the line include a same material.

* * * * *